United States Patent [19]

Assenza et al.

[11] 4,370,785

[45] Feb. 1, 1983

[54] METHOD FOR MAKING ULTRACOUSTIC TRANSDUCERS OF THE LINE CURTAIN OR POINT MATRIX TYPE

[75] Inventors: Donello Assenza; Massimo Pappalardo, both of Rome, Italy

[73] Assignee: Consiglio Nazionale Delle Ricerche, Italy

[21] Appl. No.: 157,281

[22] Filed: Jun. 6, 1980

[30] Foreign Application Priority Data

Jun. 22, 1979 [IT] Italy .............................. 49520 A/79

[51] Int. Cl.$^3$ .............................................. H01L 41/22

[52] U.S. Cl. .................................. 29/25.35; 310/336; 310/348

[58] Field of Search .................................... 29/25, 35; 310/334-336, 340, 348; 128/660-663

[56] References Cited

U.S. PATENT DOCUMENTS 3,952,387 4/1976 Iinuma et al. .................. 310/334 X 4,217,684 8/1980 Brisken et al. ..................... 29/25.35

4,277,711 7/1981 Hanaty ............................... 310/334

*Primary Examiner*—Carl E. Hall

*Attorney, Agent, or Firm*—McGlew and Tuttle

[57] ABSTRACT

Method for providing ultraacoustic transducers of the line curtain or point matrix type, and products obtained therefrom, comprising the steps of forming a bar of piezoelectric material having any length but width and thickness almost equal to each other, metalizing the faces of this bar normal to the polarization axis, sticking one of the non-metalized faces with a face of a substrate (5), depositing at least one metallic electrode on both opposite faces of the substrate normal to the face thereof connected with the bar, connecting these electrodes (8) with the metalized faces of the bar by depositing a layer of conductive epoxy resin on both opposite faces of the substrate and coating the whole assembly with a complete jacket of epoxy resin.

14 Claims, 7 Drawing Figures

FIG. 4
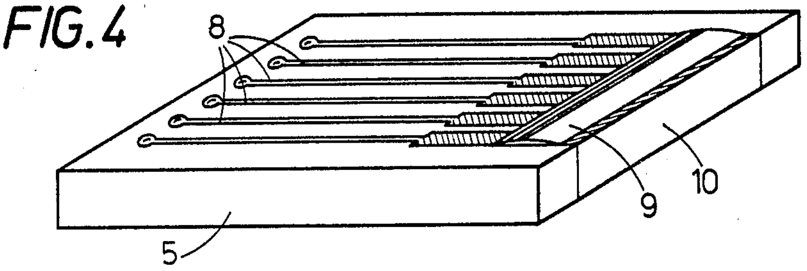
FIG. 5
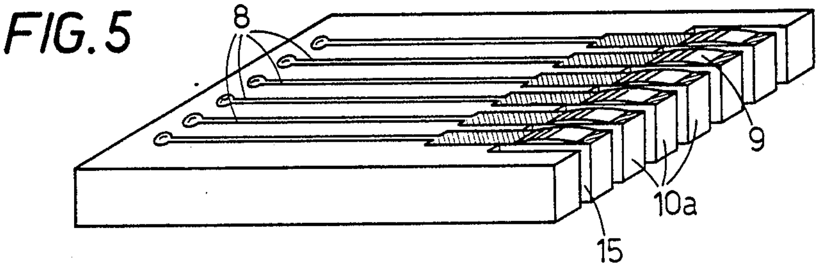
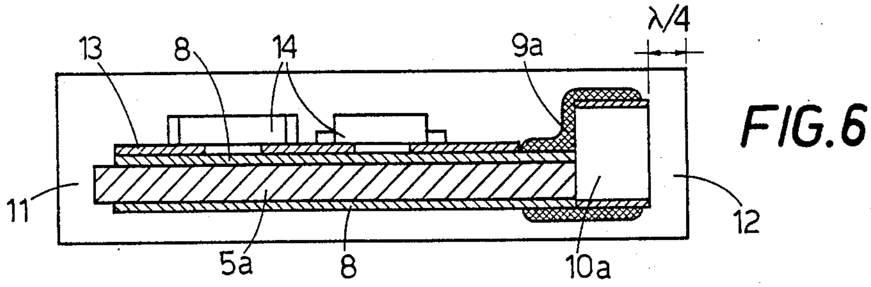
FIG. 6
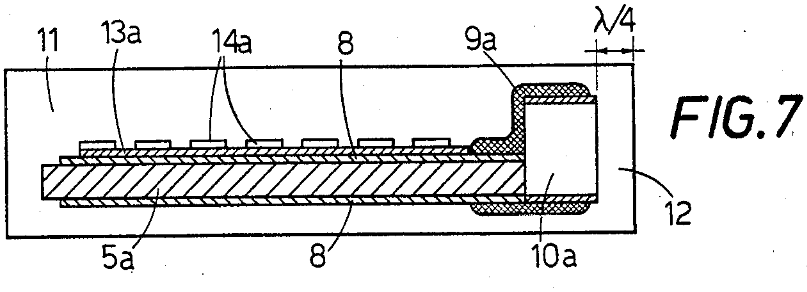
FIG. 7

METHOD FOR MAKING ULTRACOUSTIC TRANSDUCERS OF THE LINE CURTAIN OR POINT MATRIX TYPE

FIELD AND BACKGROUND OF THE INVENTION

The present invention relates to a method for providing ultraacoustic transducers of the line curtain or point matrix type and the transducers obtained therefrom, having multiple vibrating elements completely separated and acoustically decoupled from each other.

In the present state of art, particularly in the field of ultrasonic visualization, for example, for the medical diagnostics and the echography and holography tests, technical efforts are aimed at showing the image in real time or at least in a very short time.

The scanning techniques proposed in recent years are generally based on the use of multielement line curtain or point matrix transducers. By means of such a type of transducers it is possible to carry out not only an electronic scanning of the acoustic beam, but also a dynamic focusing thereof in order to increase the image resolution.

The scanning techniques carried out in this field are numerous. However, such a treatment, even if it is summary, is not considered as the object of the present invention, in which an ultraacoustic transducer and a method for its realization is exclusively illustrated. As is known an ultraacoustic transducer is a device which converts acoustic energy to electric emergy and viceversa. Such a device is based on physical processes which utilize the interaction between an electric or magnetic field and the matter of the transducer.

The multielement transducers for the ultrasonic visualization utilize the first type of interaction and this is due to the small dimensions of the single elements which have to be comparable to the wave lengths involved, which are of the order of millimeters or fractions thereof.

Although multielement transducers utilizing the electrostatic effect have recently been proposed, the present description will treat only the transducers made by electrostrictive materials (i.e. piezoelectric ceramics) or piezoelectric crystals (for example lithium niobate), since they have been used to a greater extent due to their greater sensitivity.

Both materials show the piezoelectric effect which, as is known, causes a deformation of the material to which an electric field is applied, or vice versa it generates a quantity of charge on the surface of the material which is subjected to a mechanic deformation. This property permits the generation and reception of acoustic waves. The choice of one of both types of materials depends on many factors, and particularly on the technology used for manufacturing the transducer. The techniques by which multielement transducers of the line curtain and/or point matrix type have hitherto been manufactured are essentially of three types.

As far as the first technique is concerned, each vibrating member of the transducer consists of a bar of piezoelectric material having suitable dimensions.

The bars are aligned on the same support, while the emitting surface are covered with a plate of epoxy resin which acts either as impedance adapter or to protect the single vibrators and then to create a monolithic and impermeable transducer. This technique is employed for the line curtain transducers.

Another technique which has thus far been employed is based on cutting more or less deeply, i.e. up to 93% of the thickness, a plate of piezoelectric material so as to obtain linear or punctiform emitting areas. Also in this case the plate rests on a suitable base support and is protected by an epoxy resin.

Finally a technique based on the effect known as trapping of the acoustic energy has recently been proposed. Electrode assemblies having the form of parallel strips are deposited and photoengraved on a plate of piezoelectric material. The acoustic insulation among the various elements is obtained by operating at an intermediate frequency between the resonance frequency of the vibrating mode by thickness dilatation of the area covered with the electrode and the resonance frequency relevant to the uncovered area. This causes a decay of the dominant component of the vibrating mode in the non-metalized area while going away from the metalized one.

This technique, even though it is interesting from a technological point of view, is limited by the fact that the distance between the electrodes is bound to the acoustic decoupling degree to be obtained and then it is not an independent parameter which can freely be chosen by the designer of the visualization system.

From a technological point of view the most difficult problem to be solved for providing a multielement transducer by means of the described techniques is the connection of the electrodes to any type of substrate on which more rigid electric connectors are fixed.

This connection can be carried out by the techniques developed for the thick and thin film technology. However the type of usable piezoelectric material is conditioned by the choice of these techniques. In fact these materials lose, as is known, their characteristic of piezoelectricity at a temperature near the limit temperature of Curie which is typical of each material. It is not necessary to heat the piezoelectric substrate only if the technique of ultrasonic welding of a wire is used. This technique, however, is rather delicate and not highly reliable. Furthermore, as in the case of the thermocompression welding, single connections are necessary between the electrode and the substrate. It is plain that a technique of wire-connection can be used for the construction of line assemblies only and not for point assemblies, in which each single line would be connected by wire to the single connector pins embedded in the substrate.

The characteristics of some modern piezoelectric materials are listed in the following table. All materials are ceramic except the lithium niobate which is a growth crystal.

| | $LiNbO_3$ | $PbNb_2O_6$ | PZT5A | PZT7A |
|---|---|---|---|---|
| Relative dielectric constant | 30 | 300 | 1700 | 425 |
| Piezoelectric constant ($10^{-12}$m/V) | 6 | 85 | 374 | 150 |
| Piezoelectric constant ($10^{-3}$V · m/N) | 22.6 | 32 | 24.8 | 39.9 |
| Coupling factor (%) | 16 | — | 75.2 | 66 |
| Q-factor (mechanic) | — | 15 | 75 | 600 |
| Density (g/cm$^3$) | 4.64 | 6.2 | 7.75 | 7.6 |
| Curie temperature (°C.) | 1210 | 400 | 365 | 350 |

The PZT5A and the $PbNb_2O_6$ have good characteristics both in tramission and in reception, but their Curie points are rather low. The lithium niobate shows a high Curie point but its transmission efficiency is rather low.

In the echographic applications ceramic materials have to be chosen, as high efficiency both in transmission and in reception is needed.

In the holographic systems it is on the other hand possible to use the lithium niobate crystal since the transducer is generally only used in reception. With this crystal, owing to its high Curie point, more advanced and industrialized connecting techniques developed for the production of integrated circuits have been employed. In such a case a structure of the sandwich type is utilized. It consists of a substrate on which an integrated circuit supplying a preprocessed signal can eventually be deposited and which is provided with protuberances of soldering material in a matrix arrangement being juxtaposed to the appropriately engraved plate of piezoelectric material. By heating the substrate and the piezoleectric plate up to about 200° C. under vacuum conditions and by putting on it a moderate pressure a quite good electric connection is obtained.

As already mentioned this technique, which is very attractive as it can be automated, is not suitable on the one hand for the ceramic materials due to their low Curie point and on the other hand it does not allow a visual inspection except by infrared monitors. Finally the single elements of the transducer are not loaded with materials which absorb, in a suitable manner, the acoustic radiation whereby the band width can not be wide. On the contrary this characteristic is important principally in the devices for echographic visualization.

SUMMARY OF THE INVENTION

A first object of the present invention is to provide a method for obtaining an ultraacoustic transducer which is apart from the above described methods and can be employed both for the multielement line curtain transducers and for the point matrix ones, utilizing completely separated vibrating elements and obtaining then a quite good acoustic decoupling.

The object of the present invention is achieved by a method in which use is made of a piezoelectric element according to its vibrating mode by contour dilatation and not by thickness dilatation as commonly practised in the devices of the previous art. This mode can be isolated by appropriately selecting the dimensions of the single vibrating element. In fact, to this end an experiment study has been carried out on the spectrum of the resonance frequencies and of the vibrating modes of a piezoelectric ceramic plate (PZT5A) polarised along its thickness. Without going into details of the above mentioned study it can be stated that the mode of dilatation along the width W of the plate varies almost linearly as the ratio W/t changes, where t is the thickness of the plate. For values of this ratio less than unity this is the sole mode that can be excited except for the mode of dilatation along the length which is excited at a much lower frequency.

By using then a bar of piezoelectric material having a ratio W/t near unity it is possible to isolate very well the mode of dilatation along the width and to obtain a very clean resonance, i.e. free of undesired modes about the resonance frequency of the material.

It should be noted that the obtained decoupling is much better than that achieved by the thickness mode. Therefore the method for providing an electroacoustic transducer according to the present invention is characterized by the following steps:

providing a bar of piezoelectric material of any length but having a ratio between its width and its thickness almost equal to one;

metalizing both faces of such a bar which are perpendicular to the polarization axis;

attaching or sticking this bar, along one of the non-metalized faces, to a face of a substrate;

depositing at least one metallic electrode on both opposite faces of the substrate which are normal to said face of the substrate connected with the piezoelectric bar;

connecting these metallic electrodes with the metalized faces of the piezoelectric bar by depositing a layer of conductive epoxy resin on the plane of these two opposite faces of the substrate which are normal to said face connected with the piezoelectric bar; and coating the whole assembly, i.e. bar, substrate and electrodes by a complete jacket or epoxy resin.

The present invention also relates to devices provided by the above mentioned method, i.e. an ultraacoustic line curtain or point matrix transducer characterized by a piezoelectric bar having width and thickness almost equal to each other and provided with four faces, two of which are metalized, a substrate connected with one of the non-metalized faces of the piezoelectric bar and provided with at least a metallic electrode deposited on both opposite faces thereof, which are normal to the faces connected with said one of the non-metalized faces of the piezoelectric bar, said electrode being connected with the metalized faces of the latter by a layer of conductive epoxy resin, and an external coating jacket of epoxy resin which encloses completely the bar and the substrate with electrodes. This coating is provided, for example, by a process of moulding so as to form on the non-metalized face, which acts as emitting surface of the piezoelectric ceramic and is opposed to the face connected with the substrate, a plate having the thickness of a quarter-wave of the emitted signal and acting as an impedance adapter between the piezoelectric ceramic and the load.

The single element formed as above described is very solid and impermeable. By assembling n of these elements a linear system or line curtain transducer is formed, while by the above mentioned method also a point matrix system or transducer can easily be obtained.

The method and the ultraacoustic transducer according to the present invention offer the following advantages with regard to the previous state of art. First, the piezoelectric element vibrates according to a contour dilatation mode which is less affected by spurious resonances with regard to the thickness mode used in the common techniques. Furthermore the proposed transducer can be constituted by an assembly of single elements on which it is possible to effect a preventive selection according to their electroacoustic characteristics and then to obtain so high a uniformity of such characteristics as is requested by the particular application.

This feature of the present invention should be appreciated keeping in mind that the plates of piezoelectric ceramic provide appreciable uneveness in the level of polarization along their surface. On the other hand the efficiency and the band width of the transducer depend, to a great extent, on a perfect adhesion between piezoelectric element and base support.

Either in the techniques in which the multielement electroacoustic transducer is formed by a single plate or in the techniques in which it is assembled connecting on the same base support more piezoelectric elements, it is possible to evaluate the ultraacoustic characteristics of the single elements when the manufacturing is finished. Therefore, if on the one hand it is more difficult to achieve the requested tolerances, on the other hand it is possible to effect the selection on the finished product in order to achieve these tolerances. Thus the transducer obtained by the proposed method permits the replacement of the elements that could become defective in the time and then to carry out the maintenance of the transducer which is obviously not possible by the other techniques.

From a technological point of view the use of electrical connections between the electrodes and the metalized faces of the piezoelectric bar, which are formed for example by a paint-screen process of conductive epoxy resin, is suitable for both the reliability and the cost. Furthermore this connection permits the use of piezoelectric ceramics and not crystals, which are less efficient, as these resins cure at relatively low temperatures (90° C.).

As in many fields of the technology, also in the present one, it is recognized that there is a strong tendency toward miniaturization of the electronics associated with the transducer. For example, in the sandwich construction techniques the surface of the substrate underneath the piezoelectric element is utilized for integrating a part of the electronics necessary to process the signal. In the point matrix systems of little dimensions (1×1 mm or less) such a surface is rather limited even if the present integration techniques are employed. On the contrary the ultraacoustic transducer according to the present invention can utilize a volume with a section equal to that of the vibrating element but with any length and then with sufficient space for the electronics to be integrated. Furthermore, by using a substrate having a little thickness with regard to that of the piezoelectric element it is possible to provide the necessary electronics with both thick and thin film technologies.

BRIEF DESCRIPTION OF THE DRAWINGS

The present invention will be described in detail on the basis of some embodiments and with reference to the annexed drawing, wherein:

FIG. 4 shows a transducer with a series of single electrodes printed thereon;

FIG. 5 shows the transducer of FIG. 4, wherein the electrodes are separated by cutting the piezoelectric element;

FIGS. 6 and 7 show two ultraacoustic transducers according to the present invention, wherein the electronics necessary for processing the signal have been integrated by thick and thin film techniques, respectively.

DESCRIPTION OF THE PREFERRED EMBODIMENTS

Figure 1:
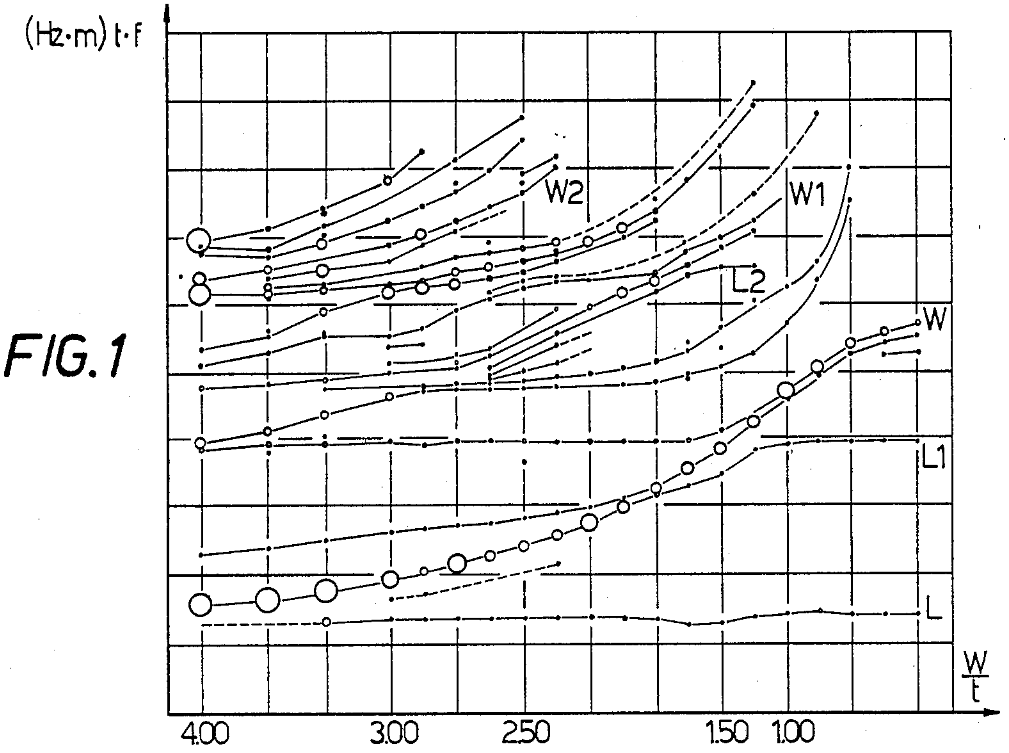
FIG. 1 is a graph illustrating the resonance frequencies versus the ratio width/thickness of the piezoelectric bar.

FIG. 1 shows a graph illustrating the resonance frequencies versus the ratio W/t, where W is the width of the plate and t is thickness thereof. The graph has been normalized plotting the product f·t in ordinate, where f is the resonance frequency, while lines relevant to the modes of dilatation along the width W and the length L are shown.

The diameter of the circles indicates the relative value of the electroacoustic coupling factor of the various modes, wherein the percentages vary from a value between 90 and 100% for the circle with the greatest diameter up to values between 0 and 10% for the circle with the smallest diameter. The small blackened circles characterize the resonances of the thickness mode.

The method according to the present invention utilizes, as mentioned above, a piezoelectric element which vibrates according to its vibration mode by contour dilatation and not by thickness dilatation as in the devices of the previous art. To reach this end, as above described, it is experimentally demonstrated that the width dilatation mode can be excited providing bars of piezoelectric material having a ratio width/thickness (W/t) almost equal to one.

Figure 2:
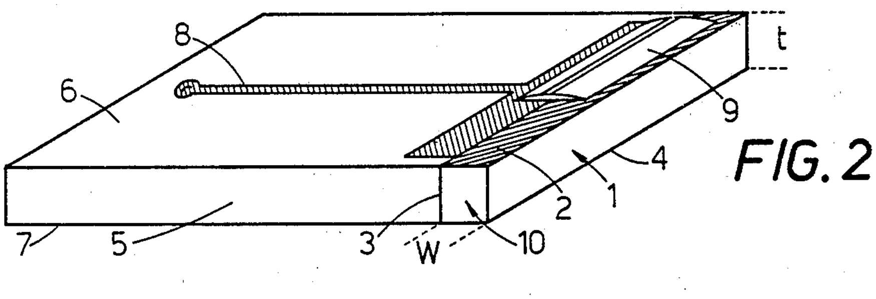
FIG. 2 shows an ultraacoustic transducer according to the present invention with only one electrode and without coating jacket.

Under these conditions ($W/t \simeq 1$) the bar of piezoelectric material 10 has four faces 1, 2, 3, 4, having areas almost equal to each other (FIG. 2). It is possible to experimentally demonstrate that the radiation efficiencies of the four faces are almost equal to each other, with the only difference that the faces 2, 4 on which the electrodes are deposited, i.e. those perpendicular to the polarization axis, emit in counterphase with regard to the faces 1, 3 that are not provided with the electrodes.

According to these experimental results the conclusion can be drawn that one of the two non-metalized faces, for example, that marked with 1 can be utilized for the acoustic emission, which is very important as far as the technology of the transducer is concerned. The bar of piezoelectric material 10 is connected along the other non-metalized face 3 to a face of a substrate 5 having the same thickness, for example.

Two electrodes 8 having the form of a strip, as shown in FIG. 2, are deposited on the two surface 6, 7 of the substrate 5 which are normal to the face connected to the bar 10. The contacts between the electrodes 8 and the metalized faces 2, 4 of the vibrator or piezoelectric bar 10 are formed by depositing a layer 9 of conductive epoxy resin having a thickness of 0.1 mm, which is obtained by a paint-screen process. The modern conductive epoxy resins have very good electrical characteristics and cure at relatively low temperatures (90° C.) so that it is possible to use piezoelectric ceramics that, as above mentioned, have the best electromechanic coupling factor. It is suitable to use the vetronite as substate 5 either as this material is a very good base support for the transducer or it is easy to deposit the electrodes thereon by the common techniques of the printed circuits.

Furthermore the vetronite is a very good base support either as it has an acoustic impedance near enough the impedance of a piezoelectric ceramic or it is a very absorbing material. Besides, if the sticking or connecting between the piezoelectric ceramic and the substrate is effected by epoxy resins an optimum contact between both materials is obtained, since the vetronite is constituted by fiber glass which are linked by the same type of resin.

Figure 3:
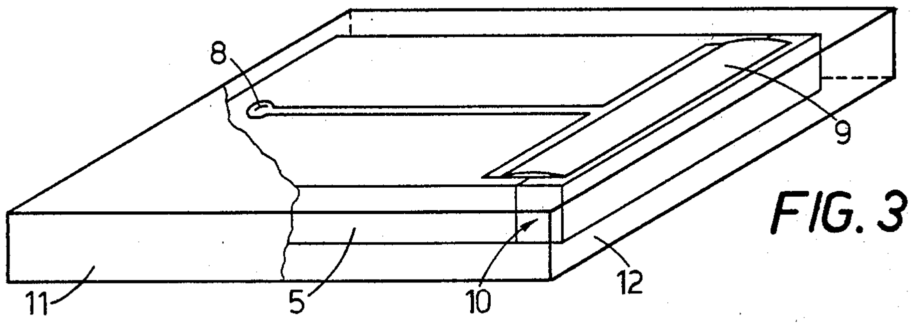
FIG. 3 shows the transducer of the FIG. 2 but with coating jacket.

The device so formed is completely coated by a jacket 11 (FIG. 3) of an epoxy resin, for example, araldite having a thickness of 0.2 mm and eventually loaded by powders of materials having a high acoustic impedance (tungsten, aluminum). Such a coating is provided by a process of moulding with a die. The die is formed so as to provide on the emitting surface of the ceramic a plate 12 having a thickness of a quarter-wave of the emitted signal and acting as impedance adapter between the ceramic and the load.

The element so formed is very solid and impermeable. By assembling n of these elements (FIG. 4) a line curtain system is provided. By the above described method also a point matrix system can easily be provided.

If a series of electrodes is printed as illustrated in FIG. 4, once the above described element is formed, it is possible to effect cuts 15 between the electrodes, which not only separate mechanically the piezoelectric elements, but also provide the necessary electrical insulation (FIG. 5).

In the latter case the substrate can be utilized to provide some electrical connections between the elements if it is requested by the designer. Furthermore it should be appreciated that it is possible to have the electrodes outside the mass of the transducer and then to operate a particular matrix addressing.

Finally, as above mentioned, the surface of the substrate can be utilized to integrate a part of the electronics necessary for processing the signal.

In the FIGS. 6 and 7 two ultraacoustic transducers are illustrated, wherein the requested electronics have been integrated by thick and thin film technologies, respectively. In both cases a substrate 5*a* is utilized having a thickness less than that of the piezoelectric element 10*a*, on which either the thick film 13 with the active and passive elements 14 (FIG. 6) or the thin film 13*a* with the associated active and passive elements 14*a* is applied. The contact between the electrode 8 and the piezoelectric bar 10*a* is still established by a layer 9*a* of epoxy resin (FIG. 7).

What is claimed is:

1. A method for making ultraacoustic transducers of the curtain line and point matrix type, comprising:

providing a bar (10) of piezoelectric material having a polarization axis and having a ratio between its width and its thickness substantially equal to one;

metalizing both faces (2,4) of said bar which are perpendicular to the polarization axis;

connecting said bar (10) along one (3) of the non-metalized faces thereof to a face of a substrate (5);

depositing at least one metallic electrode (8) on both opposite faces (6,7) of said substrate (5) which are normal to said face of said substrate (5) connected to said piezoelectric bar (10);

connecting said metallic electrodes (8) to said metalized faces (2,4) of said piezoelectric bar (10) by depositing a layer (9) of conductive epoxy resin on the plane of said two opposite faces (6,7) of said substrate (5) which are normal to said face (3) connected with said piezoelectric bar (10); and coating the whole assembly comprising said bar (10), substrate (5) and electrodes (8), with a complete jacket (11) of epoxy resin.

2. A method according to claim 1, wherein said piezoelectric material, which forms said bar (10), is a piezoelectric ceramic.

3. A method according to claim 2, wherein said piezoelectric ceramic is selected from the group consisting of lead metaniobate, PZT5A and PZT7A.

4. A method according to claim 1, wherein said piezoelectric material, which forms said bar (10), is a piezoelectric crystal.

5. A method according to claim 4, wherein said piezoelectric crystal is lithium niobate.

6. A method according to claim 1, wherein the deposit of said conductive epoxy resin on said plane of said substrate (5) for the connection with the metalized faces (2, 4) of the piezoelectric bar (10) is carried out by a paint-screen process.

7. A method according to claim 1, wherein said substrate (5) consists of vetronite.

8. A method according to claim 1, wherein said jacket (11) of epoxy resin for the complete coating of the transducer consists of araldite.

9. A method according to claim 1, wherein said coating jacket (11) is loaded with powders of materials having a high acoustic impedance.

10. A method according to claim 9, wherein said materials having a high acoustic impedance are powders of tungsten.

11. A method according to claim 9, wherein said materials having a high acoustic impedance are powders of aluminum.

12. A method according to claim 1, wherein said coating jacket (11) is formed by a process of moulding so as to provide on an emitting surface (1) of said pizeoelectric bar (10) a plate (12) having the thickness of a quarter-wave of the emitted signal in order to obtain an impedance matching between said bar (10) and a load.

13. A method according to claim 1, including providing plural electrodes (8) wherein on the transducer cuts (15) are provided between the electrodes (8) perpendicularly to the plane of the substrate, on which the same electrodes are deposited, in order to provide for the mechanical separation and the electrical insulation of the piezoelectric elements.

14. A method according to claim 1, wherein said substrate (5*a*) is provided with a thickness less than that of the piezoelectric bar (10*a*), and the necessary electronics (14, 14*a*) for processing a signal is integrated on this substrate (5*a*) by one of thick (13) and thin (13*a*) film technology.

* * * * *